(12) United States Patent
Salkovic et al.

(10) Patent No.: US 11,792,932 B2
(45) Date of Patent: Oct. 17, 2023

(54) COMPONENT CARRIER WITH EMBEDDED MAGNETIC INLAY AND INTEGRATED COIL STRUCTURE

(71) Applicant: AT&S Austria Technologie & Systemtechnik Aktiengesellschaft, Leoben (AT)

(72) Inventors: Ivan Salkovic, Zagreb (HR); Gerald Weidinger, Leoben (AT); Johannes Stahr, St. Lorenzen im Mürztal (AT)

(73) Assignee: AT&S Austria Technologie & Systemtechnik Aktiengesellschaft, Leoben (AT)

( * ) Notice: Subject to any disclaimer, the term of this patent is extended or adjusted under 35 U.S.C. 154(b) by 80 days.

(21) Appl. No.: 17/247,469

(22) Filed: Dec. 11, 2020

(65) Prior Publication Data
US 2021/0195749 A1  Jun. 24, 2021

(30) Foreign Application Priority Data
Dec. 20, 2019 (EP) .................................... 19218727

(51) Int. Cl.
*H05K 1/05* (2006.01)
*H05K 3/06* (2006.01)
(Continued)

(52) U.S. Cl.
CPC ............. *H05K 1/165* (2013.01); *H01F 27/06* (2013.01); *H05K 3/101* (2013.01); *H05K 3/4652* (2013.01);
(Continued)

(58) Field of Classification Search
CPC .......... H05K 1/05; H05K 1/115; H05K 1/165; H05K 1/024; H05K 1/065; H05K 1/0212; H05K 3/06; H05K 3/101; H05K 3/424; H05K 3/4623; H05K 3/4652; H05K 2201/085; H05K 2201/086;
(Continued)

(56) References Cited

U.S. PATENT DOCUMENTS 6,054,219 A * 4/2000 Satsu .................. H01F 41/0246
428/403
6,531,945 B1 * 3/2003 Ahn ..................... H01F 17/0033
336/200
(Continued)

FOREIGN PATENT DOCUMENTS

CN         103582297         2/2014

OTHER PUBLICATIONS

Degroote, B.; Partial European Search Report in Application No. 19218727.6; pp. 1-14; dated Aug. 27, 2020; European Patent Office; 80298, Munich Germany.
(Continued)

*Primary Examiner* — Xiaoliang Chen
(74) *Attorney, Agent, or Firm* — Robert A. Blaha; Smith Tempel Blaha LLC

(57) ABSTRACT

A method of manufacturing a component carrier includes providing a stack with electrically conductive layer structures and at least one electrically insulating layer structure, embedding a magnetic inlay in the stack, and forming an electrically conductive coil structure at least partially based on the electrically conductive layer structures and surrounding at least part of the magnetic inlay.

20 Claims, 11 Drawing Sheets

(51) Int. Cl.
*H01F 27/06* (2006.01)
*G11B 5/21* (2006.01)
*G11B 5/127* (2006.01)
*G11B 5/147* (2006.01)
*G01D 5/14* (2006.01)
*H01Q 7/06* (2006.01)
*H05K 1/16* (2006.01)
*H05K 3/10* (2006.01)
*H05K 3/46* (2006.01)

(52) U.S. Cl.
CPC .. *H01F 2027/065* (2013.01); *H05K 2201/086* (2013.01); *H05K 2201/10265* (2013.01)

(58) Field of Classification Search
CPC .......... H05K 2201/10265; H01F 27/06; H01F 27/24; H01F 27/324; H01F 27/2804; H01F 27/2895; H01F 2027/065; H01F 2027/2809; G11B 5/21; G11B 5/127; G11B 5/147; G01D 5/14; H01Q 1/243; H01Q 1/273; H01Q 7/06; H01Q 7/07
USPC ........ 174/260, 252, 255; 336/199, 200, 221, 336/223, 233; 361/736, 788; 360/2, 360/125.01
See application file for complete search history.

(56) References Cited

U.S. PATENT DOCUMENTS

| | | | | |
|---|---|---|---|---|
| 10,820,122 | B2* | 10/2020 | Gulstorff | A61N 1/37229 |
| 2002/0097132 | A1* | 7/2002 | Ahn | H01F 17/0033 336/200 |
| 2004/0263310 | A1* | 12/2004 | Ding | H01F 41/046 336/223 |
| 2005/0281425 | A1* | 12/2005 | Greuet | H04R 25/554 381/315 |
| 2007/0169851 | A1* | 7/2007 | Kugai | B22F 1/145 148/306 |
| 2007/0290783 | A1 | 12/2007 | Whittaker et al. | |
| 2011/0284267 | A1 | 11/2011 | Chang | |
| 2013/0181804 | A1* | 7/2013 | Miyamura | H01F 41/02 75/343 |
| 2013/0182401 | A1 | 7/2013 | Furutani et al. | |
| 2013/0234540 | A1* | 9/2013 | Tsutsui | H02K 19/103 310/46 |
| 2013/0257412 | A1* | 10/2013 | Wynne | G01R 15/181 324/127 |
| 2014/0104023 | A1* | 4/2014 | Yang | B22F 1/16 428/407 |
| 2014/0225701 | A1 | 8/2014 | Mano et al. | |
| 2014/0231122 | A1* | 8/2014 | Park | H05K 1/05 252/74 |
| 2014/0290986 | A1* | 10/2014 | Kim | C08L 63/00 252/75 |
| 2015/0021512 | A1* | 1/2015 | Takahashi | H01F 3/08 252/62.55 |
| 2015/0101854 | A1 | 4/2015 | Lee et al. | |
| 2015/0116947 | A1 | 4/2015 | Landon et al. | |
| 2015/0228387 | A1* | 8/2015 | Urushihara | B22F 1/102 252/62.55 |
| 2015/0348695 | A1* | 12/2015 | Kostelnik | H01F 41/046 336/200 |
| 2016/0284462 | A1 | 9/2016 | Ahn | |
| 2017/0086293 | A1 | 3/2017 | Cheng | |
| 2017/0316858 | A1* | 11/2017 | Otsubo | H01F 17/0013 |
| 2017/0339791 | A1* | 11/2017 | Adachi | H05K 1/165 |
| 2018/0076704 | A1* | 3/2018 | Kneller | H02M 1/08 |
| 2019/0333681 | A1* | 10/2019 | Wang | H05K 1/115 |
| 2019/0333682 | A1* | 10/2019 | Guo | H01F 27/2804 |
| 2019/0341184 | A1* | 11/2019 | Guo | H03H 1/00 |
| 2020/0035396 | A1* | 1/2020 | Weis | H01F 27/24 |
| 2020/0246828 | A1* | 8/2020 | Mueller | H01F 41/16 |

OTHER PUBLICATIONS

Degroote, B.; Partial European Search Report in Application No. 19218727.6; pp. 1-15; dated Nov. 20, 2020; European Patent Office; 80298, Munich Germany.

* cited by examiner

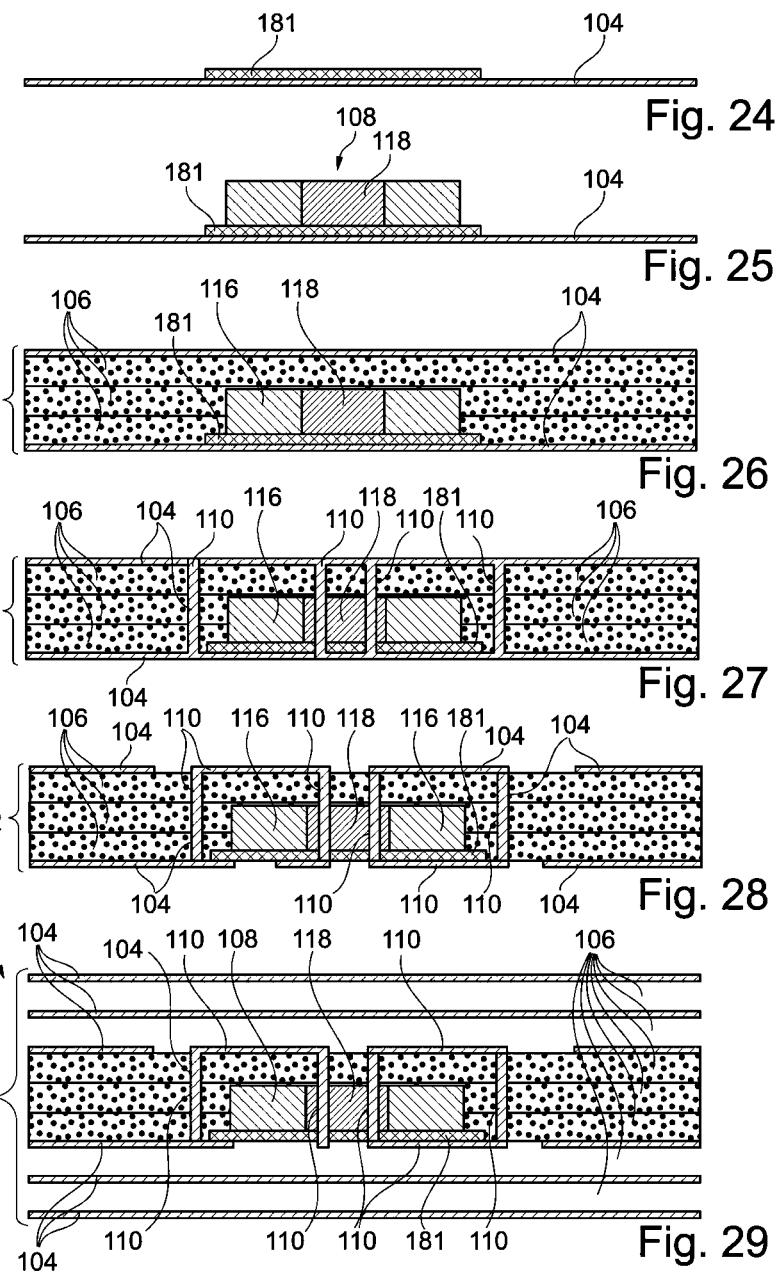

COMPONENT CARRIER WITH EMBEDDED MAGNETIC INLAY AND INTEGRATED COIL STRUCTURE

CROSS-REFERENCE TO RELATED APPLICATIONS

This application claims the benefit of the filing date of the European Patent Application No. 19218727.6, filed Dec. 20, 2019, the disclosure of which is hereby incorporated herein by reference.

TECHNICAL FIELD

The disclosure relates to a method of manufacturing a component carrier and to a component carrier.

BACKGROUND

In the context of growing product functionalities of component carriers equipped with one or more electronic components and increasing miniaturization of such components as well as a rising number of components to be connected to the component carriers such as printed circuit boards, increasingly more powerful array-like components or packages having several components are being employed, which have a plurality of contacts or connections, with ever smaller spacing between these contacts. In particular, component carriers shall be mechanically robust and electrically reliable so as to be operable even under harsh conditions.

In particular, efficiently connecting components to a component carrier is an issue. This applies in particular to component carriers to which a magnetic component shall be connected.

SUMMARY

There may be a need to efficiently connect a magnetic component to a component carrier.

According to an exemplary embodiment of the invention, a component carrier is provided which comprises a stack comprising electrically conductive layer structures and at least one electrically insulating layer structure, and a magnetic inlay embedded in the stack, wherein the electrically conductive layer structures form at least part of an electrically conductive coil structure surrounding at least part of the magnetic inlay.

According to another exemplary embodiment of the invention, a meth-od of manufacturing a component carrier is provided, wherein the method comprises providing a stack comprising electrically conductive layer structures and at least one electrically insulating layer structure, embedding a magnetic inlay in the stack, and forming an electrically conductive coil structure at least partially based on the electrically conductive layer structures and surrounding at least part of the magnetic inlay.

OVERVIEW OF EMBODIMENTS

In the context of the present application, the term "component carrier" may particularly denote any support structure which is capable of accommodating one or more components thereon and/or therein for providing mechanical support and/or electrical connectivity. In other words, a component carrier may be configured as a mechanical and/or electronic carrier for components. In particular, a component carrier may be one of a printed circuit board, an organic interposer, and an IC (integrated circuit) substrate. A component carrier may also be a hybrid board combining different ones of the above-mentioned types of component carriers.

In the context of the present application, the term "layer structure" may particularly denote a continuous layer, a patterned layer, or a plurality of non-consecutive islands within a common plane.

In the context of the present application, the term "coil structure" may particularly denote an at least partially electrically conductive structure, which may be composed of interconnected electrically conductive elements, defining one or multiple windings. The windings may have a circular shape, a rectangular shape, any other polygonal shape, etc. A coil structure may have the electric function of an electrically conductive coil.

In the context of the present application, the term "inlay" may particularly denote a pre-manufactured member which can be inserted into an opening of the stack of layer structures. Thus, the inlay can be manufactured in accordance with the requirements of its function, independently of boundary conditions of component carrier manufacturing technology. An inlay may be a single integral body (such as a closed ring) or a ring with one gap or may be an arrangement of several individual bodies (for instance a number of ring segments which can be arranged in an annular way with gaps in between), which may be arranged in a functionally cooperating way.

In the context of the present application, the term "magnetic inlay" may particularly denote an inlay comprising or consisting of magnetic material. A magnetic inlay may be composed of one or multiple connected or spaced magnetic elements. Such one or more magnetic elements may function as a magnetic core and may increase the magnetic field and thus the inductance of an inductor. For example, such a magnetic core may comprise or consist of iron and/or ferrite.

According to an exemplary embodiment of the invention, a component carrier is provided which has an embedded magnetic inlay being surrounded by a coil structure which is made of intrinsic electrically conductive component carrier material. In other words, the electrically conductive layer structures which also form the traces, vertical through-connections, pads, etc. of the component carrier may also be configured so as to form together an electrically conductive coil structure with multiple windings, or at least part thereof. In particular, an inductor with an inlay type magnetic core may be provided in which only the core needs to be embedded in the stack as an inlay, wherein the coil structure is formed by electrically conductive material of the laminated stack. By taking this measure, it may be possible to manufacture the component carrier with very low effort and without introducing additional material bridges in an interior thereof.

In the following, further exemplary embodiments of the method and the component carrier will be explained.

In an embodiment, a method of manufacturing a component carrier is provided, wherein the method comprises embedding a magnetic inlay in an opening of a stack comprising a plurality of electrically conductive layer structures and at least one electrically insulating layer structure, wherein the opening is at least temporarily closed at a bottom side by a sticky layer during the embedding, and forming an electrically conductive coil structure at least partially based on the electrically conductive layer structures and surrounding at least part of the magnetic inlay. Such an embodiment is illustrated for example in FIG. 1 to FIG. 10. In the context of the present application, the term "sticky layer" may particularly denote a tape, film, foil, sheet, or plate having an adhesive surface. In use, the sticky layer may be used to be adhered to a main surface of a stack for closing an opening extending through the stack. A magnetic inlay may be adhered to the sticky layer for defining a position of the magnetic inlay in the opening and thus relative to the stack. When the sticky layer is removed from the stack before completing manufacture of the component carrier, the sticky layer may be denoted as a temporary carrier. In other embodiments, the sticky layer may however form part of the readily manufacture component carrier. By adhering the magnetic inlay on the sticky tape during the embedding process, the spatial accuracy of the embedding of the magnetic inlay may be significantly improved. Consequently, the formation of a coil structure surrounding the magnetic inlay can be carried out with small distance with respect to the magnetic inlay due to the high positional accuracy and small tolerances. Thus, a compact component carrier with high alignment accuracy may be obtained.

In another embodiment, the method comprises mounting the magnetic inlay on at least one of the layer structures, and thereafter covering the magnetic inlay with further ones of the layer structures, wherein at least one of said layer structures is provided with an opening accommodating the magnetic inlay. Such an embodiment is illustrated for example in FIG. 24 to FIG. 29. For example, the opening of the respective layer structure may be cut as a through hole into the respective layer structure.

In an embodiment, the method comprises mounting the magnetic in-lay on the at least one of the layer structures with an adhesive structure in between. By taking this measure, a correct positioning of the magnetic inlay may be ensured.

In another embodiment, the method comprises embedding a release layer in the stack, thereafter forming an opening in the stack by removing a piece of the stack which is delimited at a bottom side by the release layer, and thereafter accommodating the magnetic inlay in the opening. Such an embodiment is illustrated for example in FIG. 30 to FIG. 38. For in-stance, such a release layer may be made of a material showing poorly adhesive properties with respect to surrounding stack material. For instance, an appropriate material for the release layer is polytetrafluoroethylene (PTFE, Teflon®), or a waxy compound. Teflon® is a registered mark of The Chemours Company FC LLC of Wilmington, Del., U.S.A.

In an embodiment, the method comprises forming a circumferential cutting trench in the stack extending up to the release layer to thereby separate the piece from a rest of the stack. Cutting said trench may be accomplished for example by laser drilling or mechanically drilling.

In an embodiment, the method comprises mounting the magnetic inlay in the opening with an adhesive structure in between. This may guarantee a correct position of the magnetic inlay in the stack, which is of utmost importance for subsequently creating constituents of the coil structure at appropriate positions and without damaging the magnetic inlay.

In another embodiment, the method comprises forming an opening in the stack by routing (preferably depth routing), and thereafter accommodating the magnetic inlay on a bottom surface of the routed stack in the opening. Such an embodiment is illustrated for example in FIG. 39 to FIG. 46. Routing is an appropriate and simple mechanism of precisely defining a blind hole-type opening for subsequently accommodating the magnetic inlay.

In an embodiment, the method comprises mounting the magnetic inlay on the bottom surface with an adhesive structure in between. This further contributes to a precise definition of the position of the magnetic inlay.

In an embodiment, the magnetic inlay is made of materials exhibiting magnetic properties, in particular soft and/or semi-hard magnetic materials. In particular, the magnetic inlay may be made of a soft magnetic material, in particular a ferrite. A ferrite may be a ceramic material which may be made by mixing and firing large proportions iron oxide ($Fe_2O_3$) blended with small proportions of one or more additional metallic elements, such as manganese, nickel, etc. Ferrites may be electrically insulating and ferrimagnetic. In particular, the magnetic inlay may comprise soft ferrite which have low coercivity, so it may easily change its magnetization. This may be in particular advantageous for applications such as high-frequency inductors and transformers. Solid ferrite structures may be formed by sintering ferrite powder. It is also possible to use ferrite platelets or flakes for manufacturing ferrite structures. However, in other exemplary embodiments, the magnetic inlay may be made of other magnetic materials, in particular ferromagnetic or ferrimagnetic or paramagnetic materials. In an embodiment, the magnetic inlay comprises a material having a magnetic permeability ($\mu r$) of at least 10, in particular of at least 500.

In an embodiment, the magnetic inlay is a closed ring. When the magnetic inlay is configured as closed ring, the embedding of the magnetic inlay is very simple, since only a single piece needs to be handled and assembled when mounting the magnetic inlay in a cavity of the stack.

In another embodiment, the magnetic inlay is a ring structure com-posed of a plurality of ring segments with at least two gaps in between. For example, said gaps may be air gaps or may be gaps filled with dielectric material. For instance, three ring segments of a magnetic inlay may be arranged with three gaps in between, and enclosing a central opening. Advantageously, it may be possible that the magnetic inlay has an annular structure which is however separated at multiple positions along its circumference so that preferably a plurality of gaps is formed around the circumference. For instance, two or three gaps may be formed. While a gap is normally considered as a loss mechanism, the provision of a plurality of sufficiently tiny gaps has nevertheless the advantage that it can be used as a design parameter for adjusting or fine-tuning the magnetic properties of the magnetic inlay. In particular, substantially homogeneous magnetic properties may be obtained when distributing multiple gaps substantially equally distributed along a perimeter of the annular magnetic inlay.

In an embodiment, a length of different gaps between ring segments of the magnetic inlay is at least 1 µm. For instance, a length of different gaps between ring segments of the magnetic inlay varies by less than 30%, in particular less than 20%. Advantageously, the gap length or width of the various gaps of the annular magnetic inlay composed of multiple ring segment bodies may deviate from each other only slightly so as to obtain circumferentially homogeneous properties. Good results can be obtained when the difference in the gap size is less than 20%. Preferably, multiple gaps between ring segments of the magnetic inlay have substantially the same length. Most preferably, the thickness of the gaps is the same between each adjacent pair of ring segments. No variations concerning the magnetic properties along the perimeter of the magnetic inlay occur under such circumstances.

In an embodiment, a recess (in particular a central opening) of the magnetic inlay is at least partially filled with a dielectric platelet, in particular made of the same material as the at least one electrically insulating layer structure (for instance FR4). For instance, said dielectric platelet may be made of a thermally conductive prepreg having a heat conductivity in a range from 2 W/mK to 20 W/mK, in particular in a range from 2 W/mK to 8 W/mK, and/or comprising thermally conductive additives. Highly advantageously, a central opening of the annular magnetic inlay may be filled with a platelet of preferably already fully cured dielectric component carrier material. For instance, the platelet which may be inserted in the central opening of the annular magnetic inlay may be made of resin, in particular epoxy resin, optionally comprising reinforcing particles such as glass fibers or glass spheres. The provision of the described platelet has multiple advantages: Firstly, configuring the platelet of dielectric stack material may prevent the introduction of an excessive number of materials with different physical properties (in particular in terms of CTE, coefficient of thermal expansion), which may improve the mechanical integrity of the component carrier as a whole. Secondly, filling the central opening with dielectric material before continuing to laminate further layer structures to the top main surface and a bottom main surface of the component carrier to be manufactured may prevent undesired voids in an interior of the component carrier. Such voids may for instance be created when the central opening of the magnetic inlay remains unfilled at the beginning of the build-up lamination. In such a scenario it may happen that only a small amount of resin may flow during the lamination process into the central opening which may result in an incomplete filling of the said opening. By filling the central opening with a platelet of FR4 or the like prior to laminating, the mechanical robustness of the component carrier may be significantly improved.

It is also possible to fill the recess with a thermo-prepreg, which is based on the already mentioned epoxy resin. These resins additionally include additives which are thermally conductive (but not electrically conductive), such as $Al_2O_3$. Thereby, the resin used to embed the magnetic component may also function in terms of thermo-management. By taking this measure, it may be in particular possible to get rid of at least part of the heat emitted by the coil structure.

In an embodiment, the coil structure comprises a plurality of vertical segments and a plurality of horizontal segments connected to form a plurality of windings. Thus, the integrated coil structure may be formed by connecting a plurality of vertically extending segments of electrically conductive material (such as copper) being connected with a plurality of correspondingly formed horizontal sections of electrically conductive material (such as copper). The various horizontal and vertical sections or segments may be interconnected so as to form altogether a plurality of windings. For instance, said windings may be arranged in a donut shape or in other words as windings being circumferentially arranged around a central axis of an annular magnetic inlay.

In an embodiment, the vertical sections comprise plated through-holes or slots filled with electrically conductive material. The vertical segments may be formed for instance by mechanically drilling or laser drilling, followed by the filling of correspondingly formed drilling holes with an electrically conductive material for instance by plating. While the vertical segments may have a substantially cylindrical geometry, they may also be slits or slots. Highly advantageously, the vertical segments may be formed as slots filled with electrically conductive material such as copper. Such slots may be cut or drilled into the stack and may be filled substantially with copper. With such slots, particularly advantageous low ohmic properties may be obtained.

In an embodiment, the horizontal segments are located in two parallel planes between which the vertical segments are connected. The horizontal segments may be formed by attaching and patterning a first metallic foil above the magnetic inlay and a second magnetic foil below the magnetic inlay. In particular, the horizontal segments may be coplanar, i.e., may extend in two horizontal planes spaced by the magnetic inlay. Also, this contributes to highly advantageous magnetic properties of the combined magnetic inlay and integrated coil structure of the component carrier.

In an embodiment, the horizontal segments extend radially outwardly with respect to a common center. Said center may correspond to a central axis of an annular magnetic inlay. Such a geometry forms the basis for circumferential windings of a for instance substantially donut-shaped coil structure.

In an embodiment, the horizontal segments are substantially triangular. The horizontal segments may for instance be substantially triangular sectors of a circle. This may ensure a low ohmic configuration.

In an embodiment, the magnetic inlay has a central opening through which part of the coil structure extends. The coil structure may be wound between an interior and an exterior of the ring-shaped magnetic inlay.

In an embodiment, the coil structure extends over a larger vertical range than the magnetic inlay. In particular, the coil structure may protrude vertically beyond the magnetic inlay upwardly and/or downwardly. Such a configuration of the coil structure may result in a laterally compact component carrier.

In an embodiment, a trajectory connecting centers of windings of the coil structure is a circumferentially closed loop, in particular extending within a horizontal plane. It may also be possible that central axes of at least part of windings of the coil structure extend within a horizontal plane. This may ensure an excellent coupling between magnetic inlay and coil structure.

In an embodiment, the magnetic inlay and the coil structure are con-figured as inductor or transformer.

In the context of the present application, the term "inductor" may particularly denote a passive (in particular two-terminal) electrical component that is capable of storing energy in a magnetic field when electric current flows through the inductor. An inductor may comprise an electrically conductive wiring wound into a coil shape around a magnetic core. When an inductor shall be embedded, a single coil structure may surround the magnetic inlay.

In an embodiment, two inductors may be magnetically coupled as a transformer. For this purpose, an inductor and a further inductor may cooperate to transfer electrical energy between different circuits through electromagnetic induction. In case of a transformer, the magnetic inlay may have multiple vertical post-like structures connected by horizontally extending magnetic bars, wherein two coil structures are wound around different ones of the vertical posts, to thereby form a primary winding and a secondary winding of the transformer. Hence, even more sophisticated magnetic functions than those of an inductor may be provided by the component carrier with embedded magnetic inlay and intrinsic coil structure.

In particular when the magnetic inlay is configured as a transformer, a lot of heat may be emitted by the coil structure. This is based on a high current density passing through the coil structure simultaneously generating a significant amount of heat. Therefore, it may be advantageous to include a heat spreading layer or any other kind of heat removal structure in the stack, in particular close to the heat generating coil structure. Such a heat spreading layer can be made out of a metal, like copper, or it can be made out of a thermo-prepreg.

In other embodiments, three or even six inductors of a component carrier may be magnetically coupled, for instance for a DC to DC converter, a DC to AC converter or motor drives.

In an embodiment, the magnetic inlay is composed of multiple vertically stacked and laterally overlapping magnetic bodies, in particular magnetic bars. Hence, in a plan view, different individual magnetic bodies of the magnetic inlay may overlap each other. Thus, the creation of gaps in a view from the top side of a component carrier can be prevented so as to obtain homogeneous magnetic properties. Descriptively speaking, a continuous and for instance wave shaped magnetic path may be established with such overlapping magnetic bodies. Such an embodiment is shown for instance in FIG. 20.

In an embodiment, the magnetic inlay (for instance made of ferrite) is at least partially coated with electrically conductive material (for instance copper) forming at least part of the coil structure. Consequently, the magnetic inlay with an integral partial coil structure may be embedded together in the stack. In other words, the magnetic inlay may be intrinsically covered by a cladding of copper material (or any other electrically conductive material). This may significantly simplify the manufacturing process of the component carrier, since a mere coating of a magnetic body with copper may provide already part of the coil structure.

In an embodiment, a minimum distance between the electrically conductive coil structure and the magnetic inlay is larger than 10 µm. Such a sufficiently large tolerance may in particular prevent an undesired damage of the magnetic inlay when drilling holes for forming vertical segments of the core structure. By ensuring a reliable spacing between the magnetic inlay and the coil structure, a defined separation between said constituents may be achieved. This ensures that the magnetic inlay is not harmed by material of the coil structure when forming the latter by drilling vertical through-holes.

In an embodiment, said minimum distance between the magnetic inlay and the coil structure is less than 30 µm. By ensuring that the distance between magnetic inlay and integrated coil structure does not become too large, the electromagnetic interaction between these constituents may be kept strong. Arranging the magnetic inlay and the coil structure spaced by not more than 30 µm may ensure a proper electric and magnetic performance of said constituents.

In an embodiment, the method comprises forming an opening in the stack, attaching the sticky layer to a bottom of the stack for closing the opening, attaching the magnetic inlay on the sticky layer, fixing the magnetic inlay in place in the opening by adhesive material (in particular by lamination or by the supply of liquid adhesive), and subsequently removing the sticky layer. Said adhesive may also be a thermally conductive prepreg. According to such a preferred embodiment, the magnetic inlay (which may be a single integral body, or which may be composed of multiple separate bodies) may be temporarily adhered in the cavity by attaching it to a sticky or adhesive surface of the temporary carrier. This may ensure that the magnetic inlay is arranged at specifically the correct position during the embedding process. After having filled gaps between the magnetic inlay inserted into the cavity and sidewalls of the stack with electrically insulating filling medium (for instance an adhesive or flowable prepreg material), the temporary carrier may be removed from a back side of the stack and from the embedded magnetic inlay, since the magnetic inlay is now fixed in place within the cavity. Thus, the temporary carrier with sticky foil may improve the spatial accuracy of the magnetic inlay in the stack, and in particular its spatial relation with respect to the coil structure.

In an embodiment, the method comprises forming the coil structure by connecting horizontal segments with vertical segments of the electrically conductive layer structures. An intrinsic formation of the coil structure partially or entirely of electrically conductive material of the component carrier stack may allow manufacturing the component carrier with low effort and low space consumption.

In an embodiment, the method comprises forming the horizontal segments by attaching and subsequently patterning at least one metal foil of the stack. Advantageously, this process may be carried out simultaneously with the formation of electrically conductive traces of the component carrier, and thus with low effort.

In an embodiment, the method comprises forming the vertical segments by drilling through holes in the stack and subsequently filling the drilled through holes with electrically conductive material. Such drilling may be accomplished by laser drilling or by mechanically drilling. The filling may be done by plating, in particular by galvanic plating, optionally in combination with electroless deposition.

In an embodiment, the component carrier comprises a stack of at least one electrically insulating layer structure and at least one electrically conductive layer structure. For example, the component carrier may be a laminate of the mentioned electrically insulating layer structure(s) and electrically conductive layer structure(s), in particular formed by applying mechanical pressure and/or thermal energy. The mentioned stack may provide a plate-shaped component carrier capable of providing a large mounting surface for further components and being nevertheless very thin and compact. The stack may be a laminated stack, i.e., formed by connecting its layer structures by the application of heat and/or pressure.

In an embodiment, the component carrier is shaped as a plate. This contributes to the compact design, wherein the component carrier nevertheless provides a large basis for mounting components thereon. Furthermore, in particular a naked die as example for an embedded electronic component, can be conveniently embedded, thanks to its small thickness, into a thin plate such as a printed circuit board.

In an embodiment, the component carrier is configured as one of the group consisting of a printed circuit board, a substrate (in particular an IC substrate), and an interposer.

In the context of the present application, the term "printed circuit board" (PCB) may particularly denote a plate-shaped component carrier which is formed by laminating several electrically conductive layer structures with several electrically insulating layer structures, for instance by applying pressure and/or by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming through holes through the laminate, for instance by laser drilling or mechanical drilling, and by filling them with electrically conductive material (in particular copper), thereby forming vias as through hole connections. Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of the present application, the term "substrate" may particularly denote a small component carrier. A substrate may be a, in relation to a PCB, comparably small component carrier onto which one or more components may be mounted and that may act as a connection medium between one or more chip(s) and a further PCB. For instance, a substrate may have substantially the same size as a component (in particular an electronic component) to be mounted thereon (for instance in case of a Chip Size Package (CSP)). More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical, thermal and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing particles (such as reinforcing spheres, in particular glass spheres).

The substrate or interposer may comprise or consist of at least a layer of glass, silicon (Si) or a photo-imageable or dry-etchable organic material like epoxy-based build-up material (such as epoxy-based build-up film) or polymer compounds like polyimide, polybenzoxazole, or benzocyclobutene-functionalized polymers.

In an embodiment, the at least one electrically insulating layer structure comprises at least one of the group consisting of resin (such as rein-forced or non-reinforced resins, for instance epoxy resin or bismaleimide-triazine resin), cyanate ester resin, polyphenylene derivate, glass (in particular glass fibers, multi-layer glass, glass-like materials), prepreg material (such as FR-4 or FR-5), polyimide, polyamide, liquid crystal polymer (LCP), epoxy-based build-up film, polytetrafluoroethylene (PTFE, Teflon®), a ceramic, and a metal oxide. Reinforcing structures such as webs, fibers, or spheres, for example made of glass (multilayer glass) may be used as well. Although prepreg particularly FR4 are usually preferred for rigid PCBs, other materials in particular epoxy-based build-up film or photo-imageable dielectric material may be used as well. For high-frequency applications, high-frequency materials such as polytetrafluoroethylene, liquid crystal polymer and/or cyanate ester resins, low temperature cofired ceramics (LTCC) or other low, very low or ultra-low DK materials may be implemented in the component carrier as electrically insulating layer structure.

In an embodiment, at least one of the electrically conductive layer structures comprises at least one of the group consisting of copper, aluminum, nickel, silver, gold, palladium, and tungsten. Although copper is usually preferred, other materials or coated versions thereof are possible as well, in particular coated with supra-conductive material such as graphene.

At least one component, which can be optionally surface mounted on and/or embedded in the stack, can be selected from a group consisting of an electrically non-conductive inlay, an electrically conductive inlay (such as a metal inlay, preferably comprising copper or aluminum), a heat transfer unit (for example a heat pipe), a light guiding element (for example an optical waveguide or a light conductor connection), an optical element (for instance a lens), an electronic component, or combinations thereof. For example, the component can be an active electronic component, a passive electronic component, an electronic chip, a storage device (for instance a DRAM or another data memory), a filter, an integrated circuit, a signal processing component, a power management component, an optoelectronic interface element, a light emitting diode, a photocoupler, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, and an energy harvesting unit. However, other components may be embedded in the component carrier. For example, a magnetic element can be used as a component. Such a magnetic element may be a permanent magnetic element (such as a ferromagnetic element, an antiferromagnetic element, a multiferroic element or a ferrimagnetic element, for instance a ferrite core) or may be a paramagnetic element. However, the component may also be a substrate, an interposer, or a further component carrier, for example in a board-in-board configuration. The component may be surface mounted on the component carrier and/or may be embedded in an interior thereof. Moreover, also other components, in particular those which generate and emit electromagnetic radiation and/or are sensitive with regard to electromagnetic radiation propagating from an environment, may be used as component.

In an embodiment, the component carrier is a laminate-type component carrier. In such an embodiment, the component carrier is a compound of multiple layer structures which are stacked and connected together by applying a pressing force and/or heat.

After processing interior layer structures of the component carrier, it is possible to cover (in particular by lamination) one or both opposing main surfaces of the processed layer structures symmetrically or asymmetrically with one or more further electrically insulating layer structures and/or electrically conductive layer structures. In other words, a build-up may be continued until a desired number of layers is obtained After having completed formation of a stack of electrically insulating layer structures and electrically conductive layer structures, it is possible to proceed with a surface treatment of the obtained layers structures or component carrier.

In particular, an electrically insulating solder resist may be applied to one or both opposing main surfaces of the layer stack or component carrier in terms of surface treatment. For instance, it is possible to form such as solder resist on an entire main surface and to subsequently pattern the layer of solder resist so as to expose one or more electrically conductive surface portions which shall be used for electrically coupling the component carrier to an electronic periphery. The surface portions of the component carrier remaining covered with solder resist may be efficiently protected against oxidation or corrosion, in particular surface portions containing copper.

It is also possible to apply a surface finish selectively to exposed electrically conductive surface portions of the component carrier in terms of surface treatment. Such a surface finish may be an electrically conductive cover material on exposed electrically conductive layer structures (such as pads, conductive tracks, etc., in particular comprising or consisting of copper) on a surface of a component carrier. If such exposed electrically conductive layer structures are left unprotected, then the exposed electrically conductive component carrier material (in particular copper) might oxidize, making the component carrier less reliable. A surface finish may then be formed for instance as an interface between a surface mounted component and the component carrier. The surface finish has the function to protect the exposed electrically conductive layer structures (in particular copper circuitry) and enable a joining process with one or more components, for instance by soldering. Examples for appropriate materials for a surface finish are Organic Solderability Preservative (OSP), Electroless Nickel Immersion Gold (ENIG), gold (in particular Hard Gold), chemical tin, nickel-gold, nickel-palladium, Electroless Nickel Immersion Palladium Immersion Gold (ENIPIG), etc.

The aspects defined above and further aspects of the invention are apparent from the examples of embodiment to be described hereinafter and are explained with reference to these examples of embodiment.

BRIEF DESCRIPTION OF THE DRAWINGS

FIG. 24, FIG. 25, FIG. 26, FIG. 27, FIG. 28 and FIG. 29 illustrate cross-sectional views of structures obtained during manufacturing a component carrier with an embedded magnetic inlay and an intrinsically formed coil structure, shown in FIG. 29, according to another exemplary embodiment of the invention.

DETAILED DESCRIPTION OF EXEMPLARY EMBODIMENTS

Figure 1:
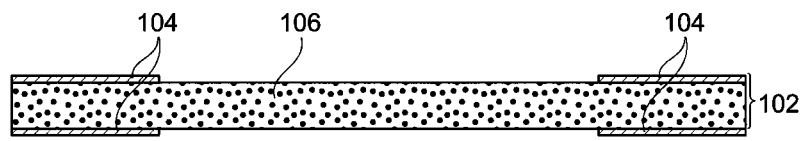
FIG. 1, FIG. 2, FIG. 3, FIG. 4, FIG. 5, FIG. 6, FIG. 7, FIG. 8, FIG. 9 and FIG. 10 illustrate cross-sectional views of structures obtained during manufacturing a component carrier with an embedded magnetic inlay and an intrinsically formed coil structure, shown in FIG. 10, according to an exemplary embodiment of the invention.

The illustrations in the drawings are schematically presented. In different drawings, similar or identical elements are provided with the same reference signs.

Before, referring to the drawings, exemplary embodiments will be described in further detail, some basic considerations will be summarized based on which exemplary embodiments of the invention have been developed.

A manufacturing method according to an exemplary embodiment of the invention provides an adhesive film- or sticky layer-enhanced PCB embedding of one or more magnetic components or inlays. A gist of an exemplary embodiment of the invention is to build for example planar magnetic components with embedded magnetic cores by embedding different type and shapes of magnetic materials. The exact placement of the magnetic inlay(s) or its individual bodies by the help of the adhesive film leads to a low tolerance magnetic component and allows to improve or even optimize drillings leading to smaller magnetic components. Gaps in the magnetic shapes may prevent them from going into saturation too fast. Gap design thus allows to define saturation and current characteristic of the component carrier with embedded coil structure and magnetic inlay. By foreseeing multiple gaps between individual bodies of a multi-body magnetic inlay, hot spots may be suppressed or even eliminated.

Hence, an exemplary embodiment of the invention enables the usage of an adhesive tape-enhanced embedding for the production of printed circuit boards (PCB) with magnetic inlays, which are not connected by vias to the PCB layout. To achieve consistent performance, ring segments of a magnetic inlay can be assembled automatically on the adhesive film in order to achieve exactly or substantially the same gap width between all the segments.

A manufacturing method according to an exemplary embodiment of the invention may allow the production of PCB-embedded magnetic sensors, inductors, transformers, wireless charging units, transmitter, and receiver units, etc. According to an exemplary embodiment, it is possible to embed a magnetic core and form a coil structure around it by PCB structuring technology and plated drillings. Embedded magnetic components may contribute to a continued miniaturization of power converters.

According to an exemplary embodiment of the invention, a component carrier (such as a printed circuit board) may be provided with an embedded magnetic inlay (composed of one or multiple bodies) being surrounded by a coil structure which may be at least partially integrally formed with the laminated stack of the component carrier. In other words, electrically conductive layer structures such as copper traces and plated through-holes may be interconnected so as to form multiple windings wound around the magnetic inlay.

Hence, a highly compact component carrier with integrated inductor or transformer function may be provided which can be manufactured with low effort and high accuracy. Particularly preferred is a manufacturing method in which the one or more individual bodies of the magnetic inlay are placed on an adhesive foil attached to a bottom main surface of the stack and closing a cavity accommodating the magnetic inlay. This may ensure that the magnetic inlay is protected against sliding or moving in the cavity which might deteriorate the functional cooperation between integrated coil structure and magnetic inlay. After having fixed the magnetic inlay in place in the cavity by curing adhesive material or previously uncured resin, the sticky tape or any other kind of immobilizing temporary carrier may again be removed from the component carrier.

According to an exemplary embodiment of the invention, an adhesive film enhanced PCB embedding of magnetic components can be carried out. For the embedding of non-contacted magnetic inlays, it is very important to define the exact position of the magnetic inlay within a cavity of a stack of a PCB. A shift from a target position can cause the destruction of the magnetic inlay during a subsequent mechanical drilling into the material for forming a coil structure. A thermally stable adhesive film or sticky layer may be used as a temporary carrier to define the exact position of the magnetic inlay or multiple bodies thereof during a lamination cycle.

Figure 8:
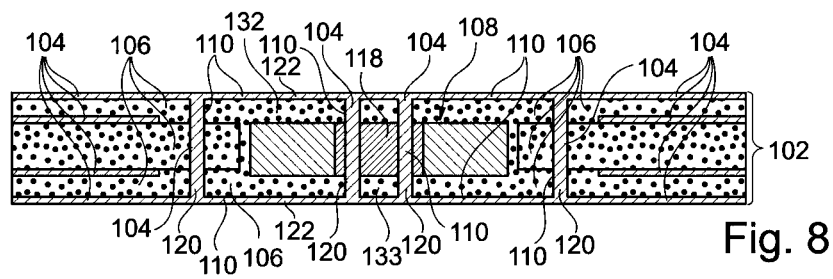
Figure 9:
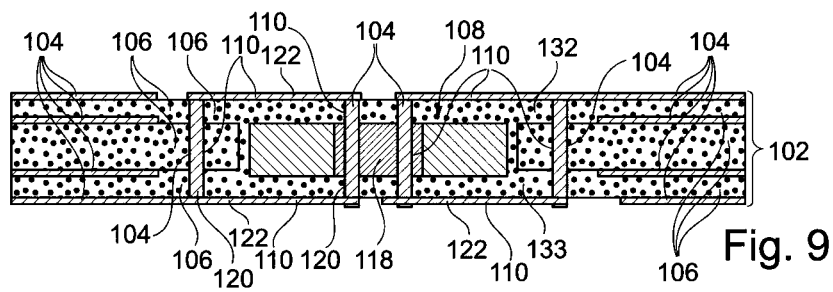
Figure 10:
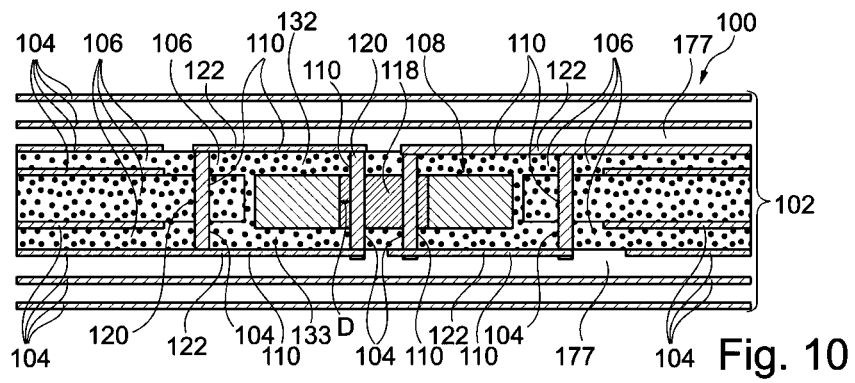

FIG. 1 to FIG. 10 illustrate cross-sectional views of structures obtained during manufacturing a component carrier 100 with an embedded magnetic inlay 108 and an intrinsically formed coil structure 110, shown in FIG. 10, according to an exemplary embodiment of the invention.

FIG. 1 illustrates a cross-sectional view of a plate-shaped laminate-type layer stack 102, which may be a core. The laminated stack 102 is composed of electrically conductive layer structures 104 and an electrically insulating layer structure 106. For example, the electrically conductive layer structures 104 may comprise patterned copper foils (and optionally one or more vertical through connections, for example copper filled laser vias). The electrically insulating layer structure 106 may comprise a resin (such as epoxy resin), optionally comprising reinforcing particles therein (for instance glass fibers or glass spheres). For instance, the electrically insulating layer structure 106 may be made of prepreg or FR4. The layer structures 104, 106 may be connected by lamination, i.e., the application of pressure and/or heat.

Thus, FIG. 1 illustrates the cross-section of a PCB (printed circuit board) core. The stack 102 is composed of a central electrically insulating layer structure 106 covered on both opposing main surfaces thereof with a respective patterned copper foil as electrically conductive layer structure 104.

Figure 2:
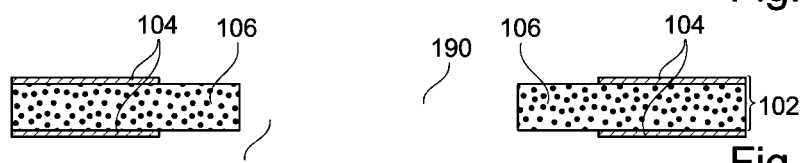

Referring to FIG. 2, an opening 190 is formed in the stack 102. More specifically, opening 190 may be cut in the stack 102 shown in FIG. 1. The formed opening 190 is later used for accommodating a magnetic inlay 108 to be embedded in the stack 102. For instance, the opening 190 may be formed by laser cutting, mechanically cutting, or etching.

Figure 3:
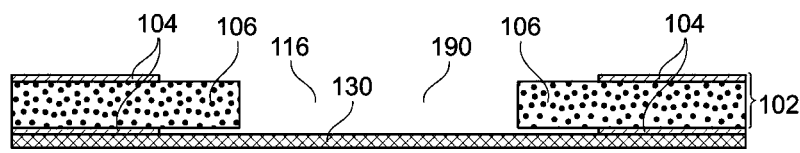

Referring to FIG. 3, a sticky layer 130 may be attached to a bottom of the stack 102 for closing the opening 190. According to FIG. 3, the upper main surface of the sticky layer 130 is sticky or adhesive. As will be described below, the sticky layer 130 will function as a temporary carrier. For instance, the sticky layer 130 may be a sticky foil or a sticky plate. Since the opening 190 is closed at a bottom side by the sticky type 130, a cavity is defined which has a volume corresponding to the opening 190 and is closed at the bottom side by the sticky layer 130. The exposed upper main surface of the temporary carrier shown in FIG. 3 is adhesive.

Figure 4:
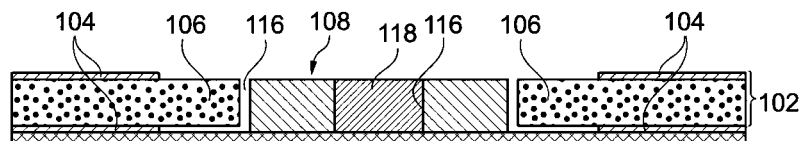

Referring to FIG. 4 a magnetic inlay 108 is subsequently attached on the sticky layer 130 and in the cavity of the stack 102. Said magnetic inlay 108 may comprise a plurality of separate segments (see for instance FIG. 11 and FIG. 12) which can be assembled separately on the sticky layer 130. In order to obtain the structure shown in FIG. 4, the magnetic inlay 130 may be inserted into the opening 190 and may be adhered to the adhesive upper side of the sticky layer 130. This is particularly advantageous when the magnetic inlay 108 is composed of multiple separate bodies. Adhering the magnetic inlay 108 on the sticky side of the sticky layer 130 may define an exact position of the magnetic inlay 108 in the cavity. The magnetic inlay 108 or its separate bodies are thereby also prevented from sliding within the cavity. A dimension of gaps (see reference sign 114 in FIG. 11 and FIG. 12) between separate bodies of the magnetic inlay 108 may be used as a design parameter for precise controlling the characteristic of the component carrier 100 with embedded magnetic inlay 108. For instance, dimensioning of said gaps 114 may also fulfil the task of ensuring that the magnetic field in the annular magnetic inlay 108 does not go into saturation. Thus, multiple ring segments or other separate bodies constituting together the magnetic inlay 108 may be advantageous. However, placing multiple separate bodies constituting together the magnetic inlay 108 into the opening 190 might be conventionally an issue because of the risk of a slight sliding or motion of one or more of the individual bodies of the magnetic inlay 108. This may introduce artefacts into the magnetic behavior of the magnetic inlay 108. However, by closing bottom of the stack 102 comprising the opening 190 with the sticky layer 130 and by subsequently adhering the individual bodies of the magnetic inlay 108 on the sticky layer 130 during an assembly process, it may be ensured that the individual bodies of the magnetic inlay 108 are located at well-defined positions and are brought in a well-defined orientation with respect to each other. Otherwise, a subsequently described method of manufacturing a coil structure 110 surrounding the magnetic inlay 108 may damage or even destroy the magnetic inlay 108, for instance when mechanically drilling for defining the position of vertical through-connections will drill into material of erroneously positioned and/or oriented bodies of the magnetic inlay 108.

Still referring to FIG. 4, a central opening 116 of the magnetic inlay 108 may be filled with a dielectric platelet 118, such as an FR4 platelet. This may ensure that only a small amount of adhesive material or of flowable resin material will be required during a lamination procedure described referring to FIG. 5 to fill the small spaces between the platelet 118 and the magnetic inlay 108. The undesired formation of voids in an interior of the stack 102 may thus be reliably prevented. Hence, the described procedure may ensure a complete filling of the opening 190 with the magnetic inlay 108, the platelet 118 and the laminated dielectric material. Assembling the platelet 118 in the cavity and on the sticky layer 130 may be performed before, during or after assembling the magnetic inlay 108 on the sticky layer 130.

Figure 5:
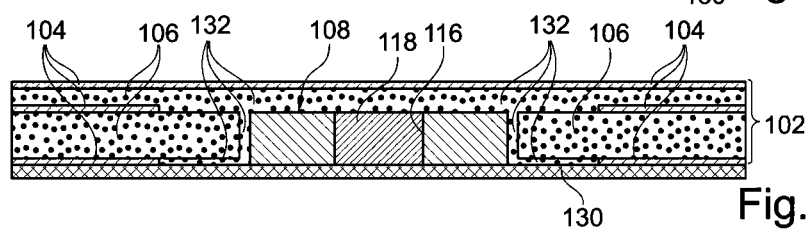

Referring to FIG. 5, the magnetic inlay 108 is fixed in place in the opening 190 by laminating adhesive material 132 onto a top side of the structure shown in FIG. 4. Thus, after assembly of the magnetic inlay 108, a first lamination procedure may be carried out which is described referring to FIG. 5. During this lamination, a further electrically conductive layer structure 104 and/or a further electrically insulating layer structure 106 is attached to the upper main surface of the arrangement shown in FIG. 4 and is made subject to lamination. Preferably, the electrically insulating layer structure 106 attached to the upper side of the stack 102 may be made of an at least partially uncured dielectric such as a prepreg sheet. During the lamination process, heat and/or mechanical pressure is applied to the stack 102 to be connected. During this lamination, the material of the previously at least partially uncured dielectric material may become flowable or liquid and may flow into tiny gaps between the assembled magnetic inlay 108 and the sidewalls of the stack 102 as well as below the magnetic inlay 108 to fill also gaps here. During the lamination, said flowable material will cure and will be re-solidified so that the magnetic inlay 108 is then fixed in place.

As an alternative to the described lamination, it is also possible to apply liquid adhesive (for instance by dispensing or printing) into remaining empty spaces of the opening 190 and cure the liquid adhesive so that the magnetic inlay 100 is fixed in place.

Figure 6:
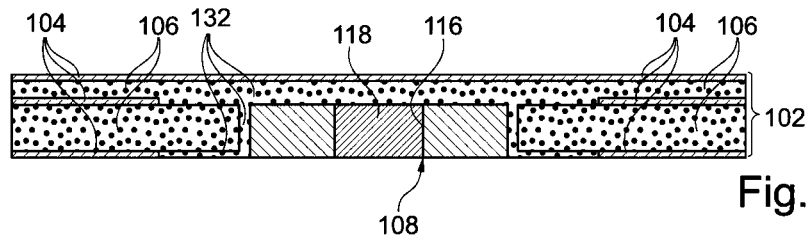

Referring to FIG. 6, the sticky layer 130 may be removed after completing the lamination. After the described lamination procedure, the temporary carrier, sticky film, or positioning layer may thus be removed from the bottom side of the component carrier 100 to be manufactured. Since, as a result of the lamination procedure, the magnetic inlay 108 with its individual ring segments has been fixed in place at the correct position within the opening 190, the sticky layer 130 is no longer needed for providing support and defining assembly positions. It is thus removed to obtain a structure shown in FIG. 6.

Figure 7:
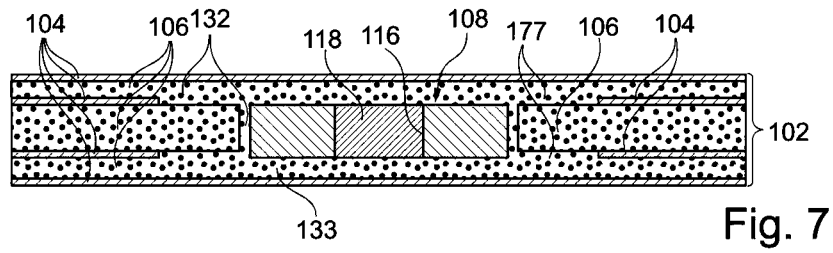

As shown in FIG. 7, the obtained structure may then be made subject to a second lamination procedure. This time, a further electrically conductive layer structure 104 and a further electrically insulating layer structure 106 may be laminated to the lower main surface of the structure of FIG. 6. In the shown embodiment, the second lamination procedure is carried out so as to obtain a symmetric arrangement of the layer stack 102 in the vertical direction. As a result, further adhesive material 133 covers a bottom of the magnetic inlay 108.

The dielectric material added according to FIG. 6 and/or FIG. 7 can also include additives increasing the thermal conductivity and thereby forming a heat removal structure 177 for removing heat from the later formed coil structure 110 and/or the magnetic inlay 108. In other words, the magnetic component in form of the magnetic inlay 108 can be embedded in a resin based on a thermo-prepreg (which may have a heat conductivity in a range from 2 W/mK to 8 W/mK).

Referring to FIG. 8, the electrically conductive layer structures 104 are then trimmed so as to form an electrically conductive coil structure 110 surrounding the magnetic inlay 108. In order to obtain the structure shown in FIG. 8, vertical drilling holes may be formed extending through the entire stack 102. Subsequently, said drilling holes, which may be formed by mechanically drilling, may be filled partially or entirely with electrically conductive material (such as copper) by plating. Thus, the obtained vertical through-connections may be hollow cylindrical or circular cylindrical structures of copper. The copper filled vertical through-holes may form vertical segments 120 of coil structure 110 being formed to surround the annular magnetic inlay 108 with a plurality of coil windings.

In order to obtain the structure shown in FIG. 9, the previously continuous metal foils (for instance copper foils) on the upper and lower main surface of the illustrated structure can be patterned so as to form horizontal segments 122 to complete the formation of closed loops or windings running circumferentially around the annular magnetic inlay 108. As a result, a plurality of closed windings is formed by the interconnection of the vertical segments 120 provided by the plated through-holes and the horizontal segments 122 provided by the patterned metal foils. The magnetic inlay 108 has a central opening 116 through which part of the coil structure 110 extends. Another part of the coil structure 110 is arranged laterally exteriorly of the magnetic inlay 108. The coil structure 110 extends over a larger vertical range than the magnetic inlay 108. More specifically, the coil structure 110 protrudes vertically beyond the magnetic inlay 108 upwardly and downwardly.

Referring to FIG. 10, component carrier 100 according to an exemplary embodiment of the invention is obtained by further laminations both on the top side and the bottom side of the structure shown in FIG. 9. In order to obtain the component carrier 100 shown in FIG. 10, a further build-up may be carried out, i.e., one or more additional electrically conductive layer structures 104 and/or one or more additional electrically insulating layer structures 106 may be added on top and/or on bottom of the structure shown in FIG. 9 by a further lamination procedure.

A heat removal structure 177 may be provided as part of the stack 102. It may be configured for removing heat from the coil structure 110 and/or the magnetic inlay 108. The heat removal structure 177 may comprises a metallic material and a thermally conductive prepreg (which may have a heat conductivity in a range from 2 W/mK to 20 W/mK, in particular in a range from 2 W/mK to 8 W/mK). Both of the laminated structures can be made out of a thermo-prepreg. In addition to that, a copper inlay can be mounted on the surface of the thermo-prepreg.

The illustrated laminate-type plate-shaped component carrier 100 may be embodied as a printed circuit board (PCB). The component carrier 100 comprises the stack 102 composed of the electrically conductive layer structures 104 and the electrically insulating layer structures 106. The magnetic inlay 108 is embedded in the stack 102. Part of the electrically conductive layer structures 104 form the integrally formed electrically conductive coil structure 110 surrounding the magnetic inlay 108. For instance, the magnetic inlay 108 may be made of a soft magnetic material such as a ferrite. The magnetic inlay 108 may be embodied as a closed ring or as an open ring having a central opening 116 filled with the dielectric platelet 118, which may be preferably made of FR4. The dielectric platelet 118 forms part of the component carrier 100. Said coil structure 110 is composed of the vertical segments 120 and the horizontal segments 122 which are interconnected to form a plurality of windings. The vertical segments 120 may be formed as plated through-holes or slots filled with electrically conductive material. The horizontal segments 122 may lie in two parallel planes and may have for instance comprise substantially triangular sub-sections being interconnected with the vertical segments 122 thereby form coil windings surrounding the magnetic inlay 108. Still referring to FIG. 10, a minimum distance D between the electrically conductive coil structure 110 and the magnetic inlay 108 may be advantageously larger than 10 and less than 30 μm.

Figure 11:
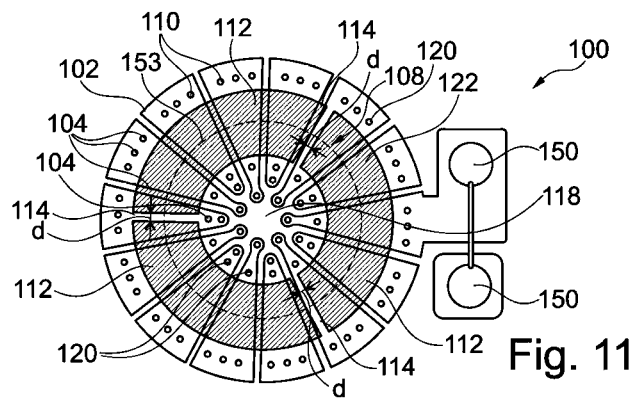
FIG. 11, FIG. 12 and FIG. 13 illustrate plan views of component carriers according to exemplary embodiments of the invention.
Figure 12:
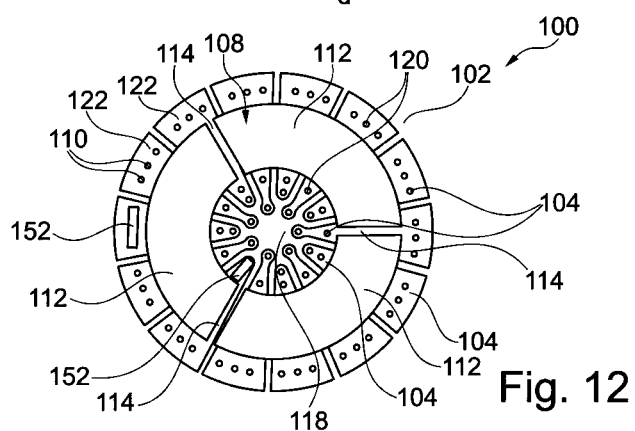
Figure 13:
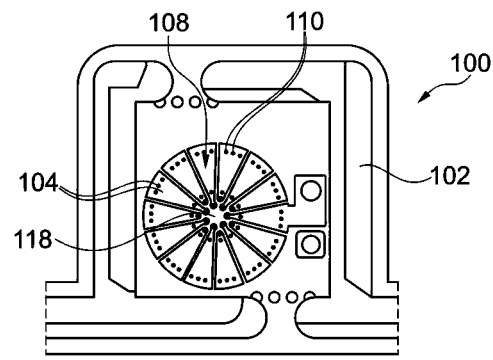

FIG. 11 to FIG. 13 illustrate plan views of component carriers 100 according to exemplary embodiments of the invention.

Referring to FIG. 11, the magnetic inlay 108 is a ring structure composed of three ring segments 112 with three gaps 114 in between. A thickness d of different gaps 114 between ring segments 112 of the magnetic inlay 108 vary preferably less than 20%. Even more preferably, the multiple gaps 114 between adjacent ring segments 112 of the magnetic inlay 108 may have substantially the same length d.

The plan view of the magnetic inlay 108 with surrounding integrated coil structure 110 of FIG. 11 shows that in this embodiment the magnetic inlay 108 is provided as a substantially annular body composed of three ring segments 112 with three gaps 114 in between. The coil structure 110 surrounding the ferrite material of the magnetic inlay 108 comprises the substantially triangular circle sector type horizontal segments 122. Cylindrical vertical segments 120 are provided at a radially inner side of the horizontal segments 122 and at a radially outer side of the horizontal segments 122 and can thereby connect with the horizontal segments 122 to form windings of the coil structure with substantially rectangular geometry in a side view (compare FIG. 10). Coil connections are denoted with reference numeral 150 in FIG. 11.

Now referring to FIG. 12, a plan view of a magnetic inlay 108 surrounded by windings of the coil structure 110 of an exemplary embodiment of the invention is shown. As indicated with reference numeral 152, the vertical segments 120 with circular shape can be substituted and/or supplemented by slots filled with electrically conductive material such as copper and extending vertically to the paper plane of FIG. 12. Descriptively speaking, it is for instance possible to combine multiple (in particular two or three) radially arranged and/or tangentially arranged circular vertical segments 120 to a single common vertical slot segment 152. This may provide a low ohmic configuration which increases the current carrying capability, reduces the generation of heat in an interior of the component carrier 100 and results in lower losses.

As can also be taken from FIG. 12, the vertical segments 120 pro-vided in the center region of a circular magnetic inlay 108 may be arranged radially (i.e., one after another along a radial direction), whereas vertical segments 120 provided in a radially outermost region of the circular magnetic inlay 108 may be arranged one after another tangentially (or circumferentially). Thereby, the little available space in the center may be used efficiently due to the radial arrangement of the vertical segments 120 provided in the center region, while at the same time the radius of the component carrier 100 is not increased, due to the tangential arrangement of the vertical segments 120 provided in a radially outermost region. Furthermore, the horizontal segments 122 may have a relatively simple shape, such as a substantially triangular shape. In other words, it may not be necessary to provide a complex shape in order to accommodate the vertical segments 120 when vertical segments 120 provided in the center region are arranged radially. Thus, assembly of the component carrier may be more efficient.

By providing a zigzag connection of horizontal segments 122 and vertical segments 120, closed windings of the coil structure may be created.

As can be derived from FIG. 11 and FIG. 12, a trajectory connecting centers of windings of the coil structure 110 is a circumferentially closed loop extending within a horizontal plane. Central axes of the windings of the coil structure 110 extend within a horizontal plane. This is indicated schematically in FIG. 11 with a circle 153.

FIG. 13 shows the magnetic inlay 108 with coil structure 110 together with further constituents of a component carrier 100 according to an exemplary embodiment of the invention.

Figure 14:
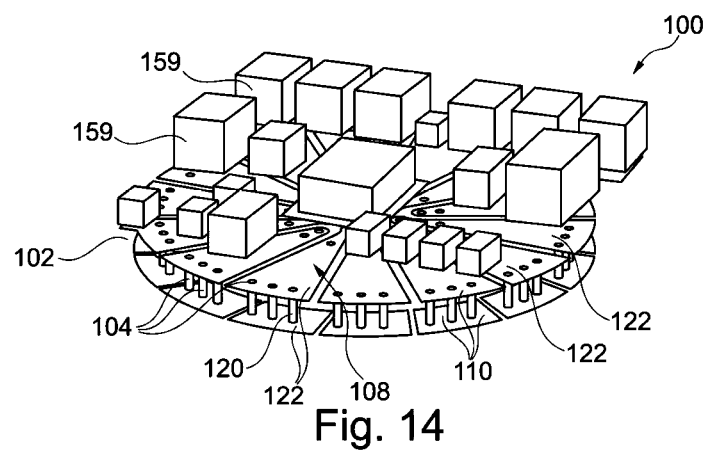
FIG. 14 and FIG. 15 illustrate three-dimensional views of component carriers according to exemplary embodiments of the invention.
Figure 15:
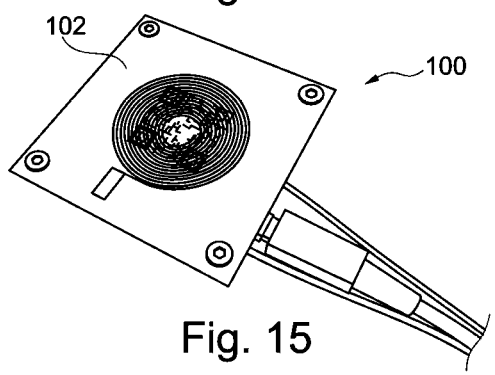

FIG. 14 and FIG. 15 illustrate three-dimensional views of component carriers 100 according to exemplary embodiments of the invention.

FIG. 14 shows a three-dimensional view of a component carrier 100 according to an exemplary embodiment of the invention with a number of components 159 which can be coupled to the described magnetic structure.

FIG. 15 shows a component carrier 100 configured as a wireless charger. What concerns the wireless charging function of the component carrier 100, applying an electric current to the coil structure 110 generates an electromagnetic field in the environment of the component carrier 100. The magnetic inlay 108 of very high magnetic permeability enhances the electromagnetic field. When a mobile phone or other electronic device to be charged in a wireless manner is positioned in an environment of the component carrier 100 and when such an electronic device comprises a corresponding receiver unit, the electromagnetic field generated by the component carrier 100 may be used for charging the electronic device.

FIG. 16 to FIG. 19 illustrate plan views of inductor structures which may be implemented in component carriers 100 according to exemplary embodiments of the invention.

Figure 16:
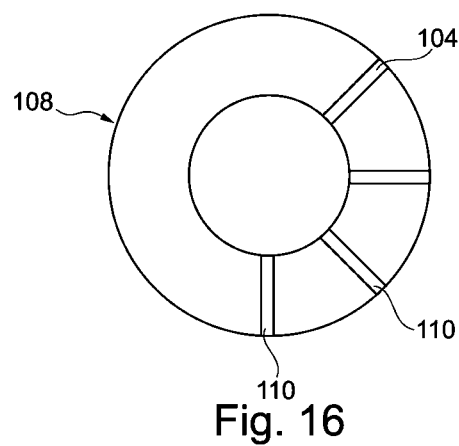
FIG. 16, FIG. 17, FIG. 18 and FIG. 19 illustrate plan views of inductor structures which may be implemented in component carriers according to exemplary embodiments of the invention.

In the embodiment of FIG. 16, the magnetic inlay 108 with surrounding coil structure 110 is embodied as a toroid structure. This has the advantage of a very low leakage flux.

Figure 17:
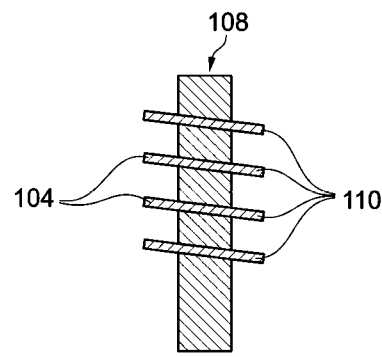

In the embodiment of FIG. 17, the magnetic inlay 108 has a rectangular shape with coil structures 110 wound thereon. This may ensure an easy design and an easy manufacturing process and provides sufficiently via spacing.

Figure 18:
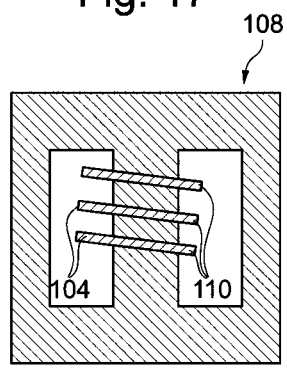

As shown in the embodiment of FIG. 18, an equal configuration is illustrated which is highly appropriate for coupled inductors. Moreover, such a configuration ensures a sufficiently large via spacing and a low leakage flux.

Figure 19:
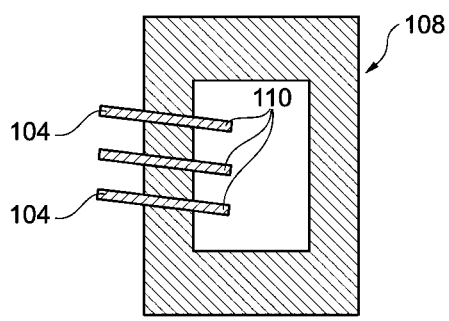

In the embodiment of FIG. 19, the magnetic inlay 108 has a core configuration with high via spacing and sufficient leakage flux.

Figure 20:
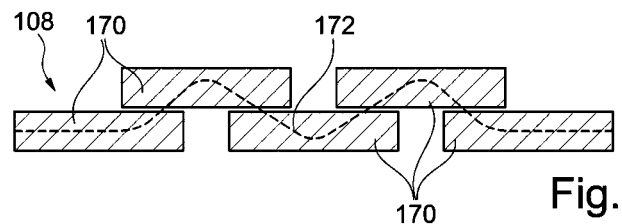
FIG. 20 illustrates a side view of multiple segments of a magnetic inlay of a component carrier according to an exemplary embodiment of the invention arranged to obtain a substantially continuous magnetic flow.

FIG. 20 illustrates a side view of multiple segments 170 of a magnetic inlay 108 of a component carrier 100 according to an exemplary embodiment of the invention arranged to obtain a substantially continuous magnetic flow which is indicated schematically by reference sign 172. Descriptively speaking, the magnetic inlay 108 of FIG. 20 arranges the segments 170 in two planes in an overlapping manner for obtaining a for instance wave-shaped magnetic flow. Hence, the illustrated magnetic inlay 108 is composed of multiple vertically stacked and horizontally overlapping magnetic bodies or segments 170, in particular magnetic bars.

Figure 21:
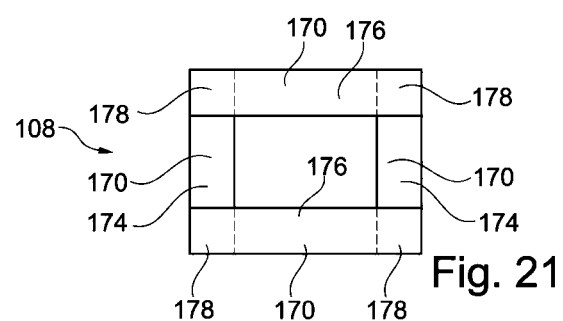
FIG. 21 illustrates a top view of multiple overlapping segments of a magnetic inlay of a component carrier according to an exemplary embodiment of the invention.

FIG. 21 illustrates a top view of multiple overlapping segments 170 of a magnetic inlay 108 of a component carrier 100 according to an exemplary embodiment of the invention. The segments 170 are arranged in two vertically spaced planes, i.e., first segments 174 in a lower plane and segments 176 in an upper plane. Overlapping regions 178 ensure the provision of substantially close magnetic paths, which may be advantageous for instance when a transformer is built.

Figure 22:
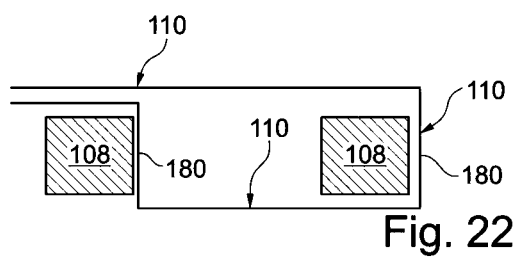
FIG. 22 illustrates an arrangement of a magnetic inlay and a coil structure comprising slotted vertical segments for obtaining a short length and a low ohmic configuration.

FIG. 22 illustrates an arrangement of a magnetic inlay 108 and a coil structure 110 comprising slotted vertical segments 180 for obtaining a short length and a low ohmic configuration. Furthermore, large cross-sectional areas may be obtained by forming slots.

Figure 23:
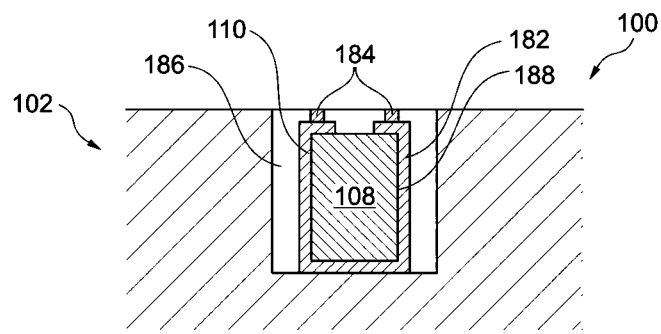
FIG. 23 illustrates a magnetic inlay with a copper cladding forming part of a coil structure of a component carrier according to an exemplary embodiment of the invention.

FIG. 23 illustrates a magnetic inlay 108 with a copper cladding 182 forming part of a coil structure 110 of a component carrier 100 according to an exemplary embodiment of the invention. One or more electrically conductive connection elements 184, for instance copper filled microvias, may accomplish an electric connection of the copper cladding 182 surrounding the magnetic inlay 108 (for instance made of ferrite) embedded in hole 186 of stack 102. For decoupling the magnetic inlay 108 with respect to the coil structure 110 formed partially by the copper cladding 182, it may be possible for coat the magnetic inlay 108 with a dielectric coating 188 (for instance made of an epoxy resin or parylene) before forming the copper cladding 182. In FIG. 23, the magnetic inlay 108 is thus cladded with electrically conductive material forming part of the coil structure 110, so that the magnetic inlay 108 with integral coil structure 110 is embedded together in the stack 102.

FIG. 24 to FIG. 29 illustrate cross-sectional views of structures obtained during manufacturing a component carrier 100 with an embedded magnetic inlay 108 and an intrinsically formed coil structure 110, shown in FIG. 29, according to another exemplary embodiment of the invention.

Referring to FIG. 24, an adhesive structure 181 (such as an adhesive paste) may be printed on an electrically conductive layer structure 104, in particular a copper foil.

Referring to FIG. 25, a magnetic inlay 108 may be assembled and adhered to the adhesive structure 181 on said electrically conductive layer structure 104.

Referring to FIG. 26, the magnetic inlay 108 may be covered with electrically insulating layer structures 106 and a further electrically conductive layer structure 104. The electrically insulating layer structures 106 at lower levels may be provided with a through hole or a blind hole for accommodating the magnetic inlay 108 in said holes. More specifically, the magnetic inlay 108 may be laminated with cut-out prepreg layers. If at least one of said electrically insulating layer structures 106 is at least partially uncured (for instance is in a B-stage), no adhesive paste is needed in addition, since the constituents of the structure shown in FIG. 26 may be connected with each other by lamination, i.e., the application of heat and/or pressure.

Referring to FIG. 27, constituents of an electrically conductive coil structure 110 may be formed, for instance by drilling and plating.

Referring to FIG. 28, a structure is shown which is obtained by patterning electrically conductive layer structures 104 on both opposing main surfaces of the structure shown in FIG. 27.

Referring to FIG. 29, additional electrically conductive layer structures 104 and electrically insulating layer structures 106 are added on both opposing main surfaces of the structure shown in FIG. 28, to thereby complete manufacture of component carrier 100.

Figure 36:
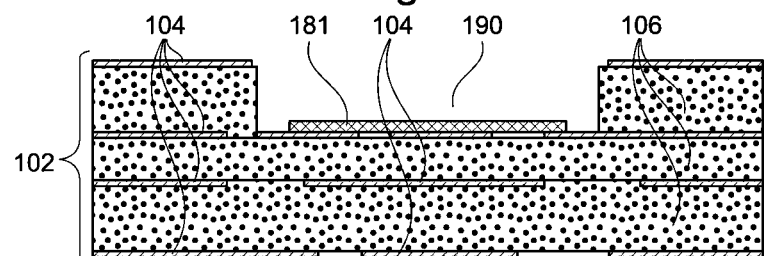
Figure 37:
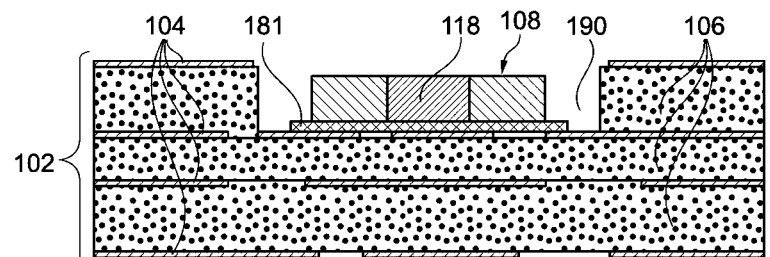
Figure 38:
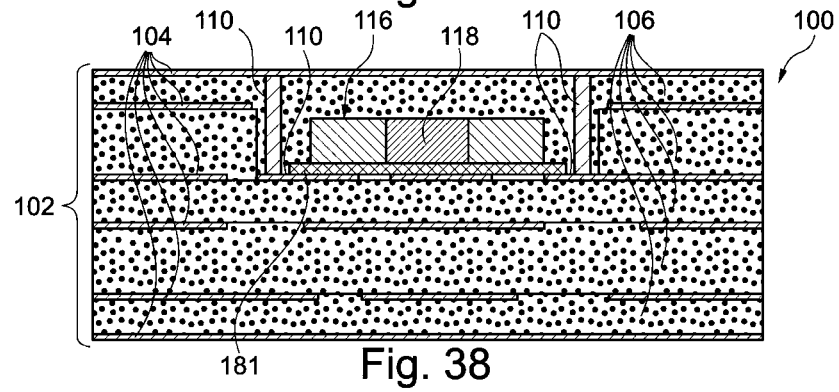

FIG. 30 to FIG. 38 illustrate cross-sectional views of structures obtained during manufacturing a component carrier 100 with an embedded magnetic inlay 108 and an intrinsically formed coil structure 110, shown in FIG. 38, according to another exemplary embodiment of the invention.

Figure 30:
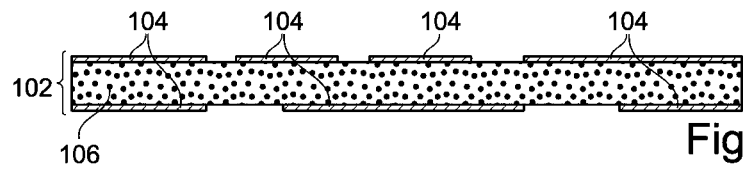
FIG. 30, FIG. 31, FIG. 32, FIG. 33, FIG. 34, FIG. 35, FIG. 36, FIG. 37 and FIG. 38 illustrate cross-sectional views of structures obtained during manufacturing a component carrier with an embedded magnetic inlay and an intrinsically formed coil structure, shown in FIG. 38, according to still another exemplary embodiment of the invention.

Referring to FIG. 30, a stack 102 composed of a central electrically insulating layer structure 106 and patterned electrically conductive layer structures 104 on both opposing main surfaces thereof is shown. For instance, stack 102 may be embodied as PCB (printed circuit board) core.

Figure 31:
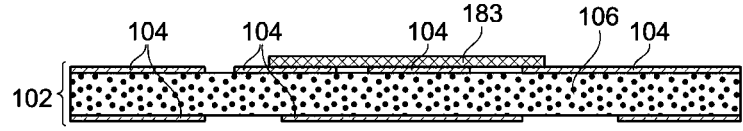

Referring to FIG. 31, a release layer 183 is formed at a surface of the stack 102. For instance, the release layer 183 may be printed in form of a waxy compound on the upper main surface of the stack 102 shown in FIG. 30. Thus, the release layer 183 may be made of a material being poorly adhesive with respect to other materials of stack 102.

Figure 32:
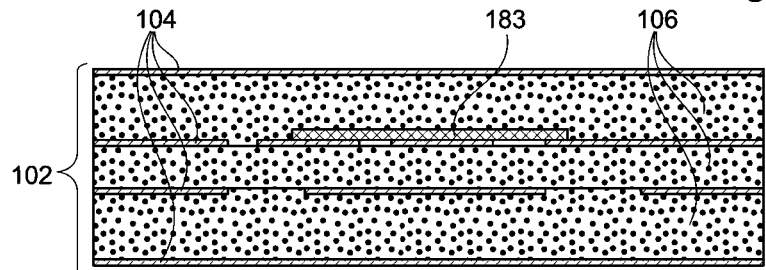

Referring to FIG. 32, further electrically conductive layer structures 104 and electrically insulating layer structures 106 may be connected to both the upper main surface and the lower main surface of the structure shown in FIG. 31 to thereby embed the release layer 183 within the stack 102.

Figure 33:
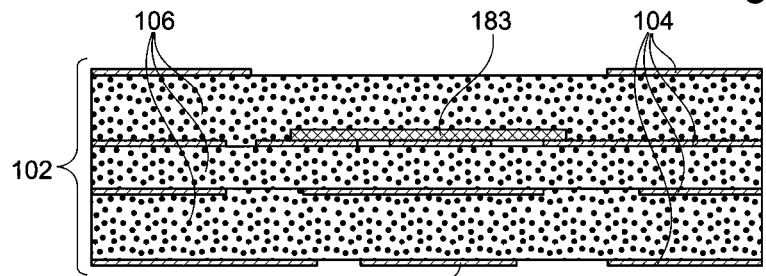

Referring to FIG. 33, previously continuous electrically conductive layer structures 104 on both opposing main surfaces of the structure illustrated in FIG. 32 are patterned.

Figure 34:
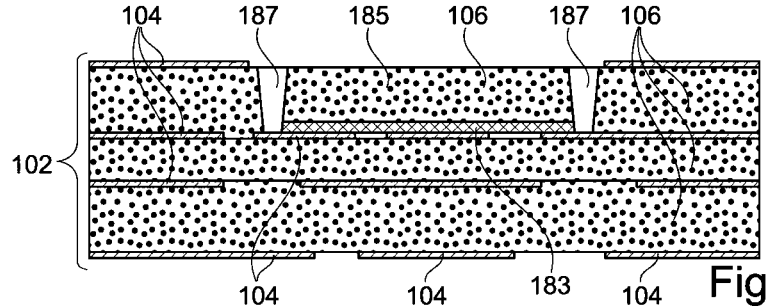

Referring to FIG. 34, a circumferential cutting trench 187 is cut in the stack 102 to extend vertically up to the release layer 183. Cutting trench 187 may for example be formed by laser cutting or by mechanically cutting. Thereby, a stack piece 185 is separated from a rest of the stack 102. Laterally, piece 185 is separated by the cutting trench 187. At a bottom side, piece 185 is separated by the non-adhesive release layer 183.

Figure 35:
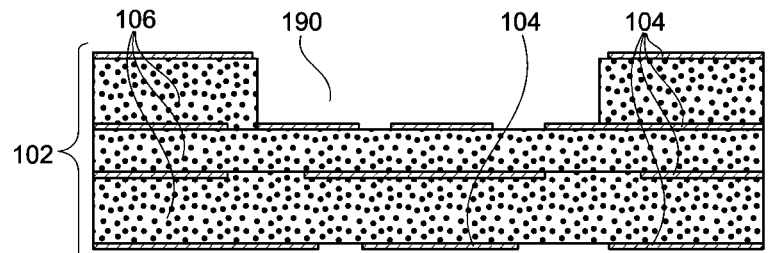

Referring to FIG. 35, a blind hole-type opening 190 is formed in the stack 102 by removing said cap-shaped piece 185 from the stack 102. As shown, piece 185 is delimited at a bottom side by the release layer 183 and laterally by the circumferential or annular trench 187. Thereafter, the release layer 183 may be removed, for instance by stripping.

Referring to FIG. 36, an adhesive structure 181 is formed at a bottom surface of the blind hole-type opening 190. For instance, a layer of an adhesive material may be printed with a stencil.

Referring to FIG. 37, a magnetic inlay 108 is mounted on the bottom surface in the opening 190 with the adhesive structure 181 in between. In other words, the magnetic inlay 108 may be assembled and accommodated in the opening 190.

Referring to FIG. 38, one or more further electrically conductive layer structures 104 and electrically insulating layer structures 106 may be laminated on top of the structure shown in FIG. 37 to thereby embed the magnetic inlay 108 within an interior of the stack 102.

Although not shown in detail, it is subsequently possible to create electrically conductive structures by drill and via technology, thereby forming electrically conductive coil structure 110. Reference is made to the description of FIG. 8 to FIG. 10 and FIG. 27 to FIG. 29.

Figure 44:
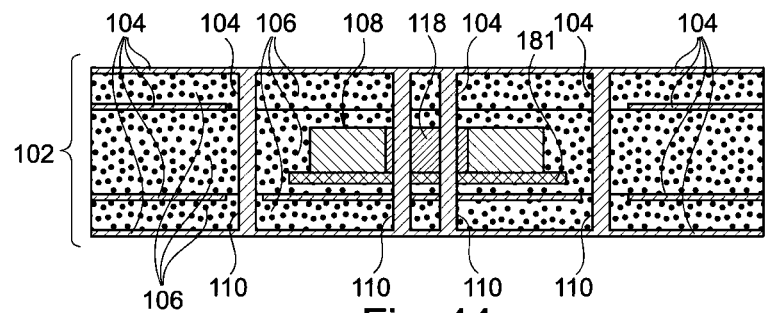
Figure 45:
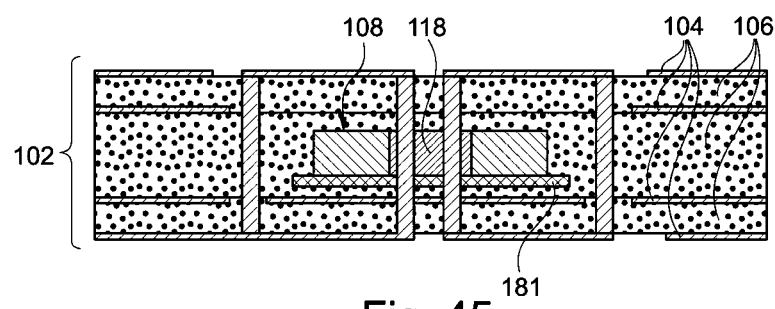
Figure 46:
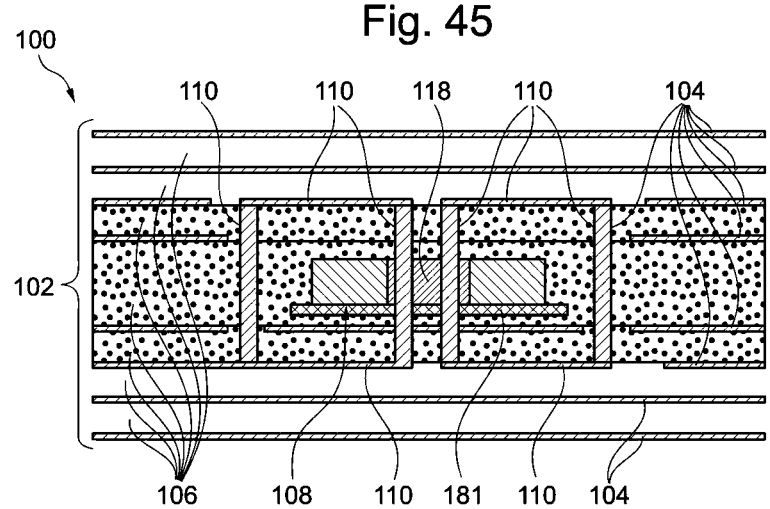

FIG. 39 to FIG. 46 illustrate cross-sectional views of structures obtained during manufacturing a component carrier 100 with an embedded magnetic inlay 108 and an intrinsically formed coil structure 110, shown in FIG. 46, according to another exemplary embodiment of the invention.

Figure 39:
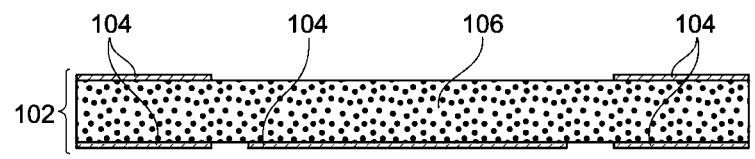
FIG. 39, FIG. 40, FIG. 41, FIG. 42, FIG. 43, FIG. 44, FIG. 45 and FIG. 46 illustrate cross-sectional views of structures obtained during manufacturing a component carrier with an embedded magnetic inlay and an intrinsically formed coil structure, shown in FIG. 46, according to yet another exemplary embodiment of the invention.

Referring to FIG. 39, starting point of the manufacturing process may be a PCB-core as stack 102, which may be constituted for instance in a similar way as shown in FIG. 1 or FIG. 30.

Figure 40:
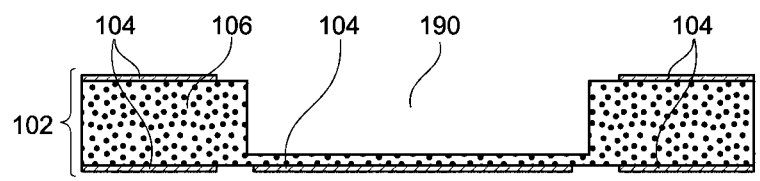

Referring to FIG. 40, a blind hole-type opening 190 is formed with a closed bottom side in the stack 102 by depth routing.

Figure 41:
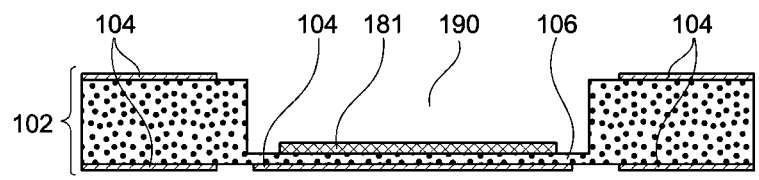

Referring to FIG. 41, an adhesive structure 181 is formed on a bottom surface delimiting opening 190. For instance, said adhesive material may be applied by stencil printing.

Figure 42:
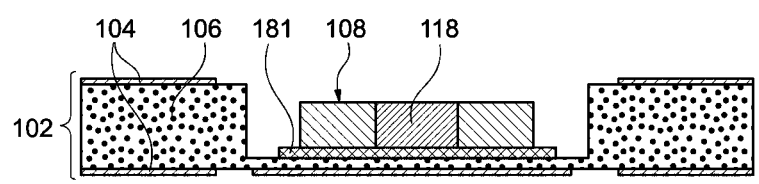

Referring to FIG. 42, a magnetic inlay 108 is assembled on the bottom surface with the adhesive structure 181 in between. In other words, the magnetic inlay 108 is accommodated on a bottom surface of the routed stack 102 in the opening 190.

Figure 43:
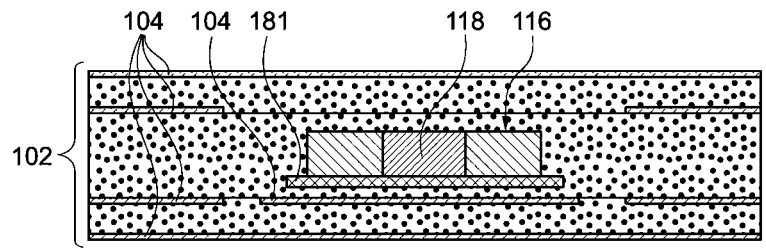

Referring to FIG. 43, one or more further electrically conductive layer structures 104 and electrically insulating layer structures 106 may be laminated on top and on bottom of the structure shown in FIG. 42 to thereby embed the magnetic inlay 108 in an interior of the stack 102.

Referring to FIG. 44, a portion of electrically conductive coil structure 110 is formed by a drill and fill process.

Referring to FIG. 45, the obtained structure is patterned.

Referring to FIG. 46, one or more further electrically conductive layer structures 104 and electrically insulating layer structures 106 may be laminated on top and on bottom of the structure shown in FIG. 45, to thereby complete manufacture of component carrier 100.

It should be noted that the term "comprising" does not exclude other elements or steps and the article "a" or "an" does not exclude a plurality. Also, elements described in association with different embodiments may be combined.

Implementation of the invention is not limited to the preferred embodiments shown in the figures and described above. Instead, a multiplicity of variants is possible which variants use the solutions shown and the principle according to the invention even in the case of fundamentally different embodiments.

The invention claimed is:

1. A method of manufacturing a component carrier, comprising:
   providing a stack comprising electrically conductive layer structures and at least one electrically insulating layer structure;
   embedding a magnetic inlay in the stack; and
   forming an electrically conductive coil structure at least partially based on the electrically conductive layer structures and surrounding at least part of the magnetic inlay such that a length of different gaps between ring segments of the magnetic inlay is at least 1 μm.

2. The method according to claim 1, wherein the method comprises at least temporarily closing an opening in the stack at a bottom side by a sticky layer during the embedding.

3. The method according to claim 2, wherein the method comprises:
   forming the opening in the stack;
   attaching the sticky layer to a bottom of the stack for closing the opening;
   adhering the magnetic inlay on the sticky layer; and
   fixing the magnetic inlay in place in the opening by adhesive material by lamination.

4. The method according to claim 2, wherein the method comprises removing the sticky layer after the embedding after the fixing.

5. The method according to claim 1, wherein the method comprises:
   mounting the magnetic inlay on at least one of the layer structures; and
   thereafter covering the magnetic inlay with further ones of the layer structures, wherein at least one of said layer structures is provided with an opening accommodating the magnetic inlay;
   wherein the method comprises mounting the magnetic inlay on the at least one of the layer structures with an adhesive structure in between.

6. The method according to claim 1, further comprising:
   embedding a release layer in the stack;
   thereafter forming an opening in the stack by removing a piece of the stack which is delimited at a bottom side by the release layer; and
   thereafter accommodating the magnetic inlay in the opening.

7. The method according to claim 6, comprising at least one of the following features:
   wherein the method comprises forming a circumferential trench in the stack extending up to the release layer to thereby separate the piece from a rest of the stack;
   wherein the method comprises mounting the magnetic inlay in the opening with an adhesive structure in between.

8. The method according to claim 1, wherein the method comprises:
   forming an opening in the stack by routing; and
   thereafter accommodating the magnetic inlay in the opening and on a bottom surface of the routed stack;
   wherein the method comprises mounting the magnetic inlay on the bottom surface with an adhesive structure in between.

9. The method according to claim 1, wherein the method comprises forming the electrically conductive coil structure by connecting horizontal segments with vertical segments of the electrically conductive layer structures.

10. The method according to claim 9, comprising at least one of the following features:
    wherein the method comprises forming the horizontal segments by attaching and subsequently patterning at least one metal foil of the stack;
    wherein the method comprises forming the vertical segments by drilling through holes in the stack and subsequently at least partially filling the drilled through holes with electrically conductive material.

11. A component carrier, comprising:
    a stack comprising electrically conductive layer structures and at least one electrically insulating layer structure; and
    a magnetic inlay embedded in the stack;
    wherein the electrically conductive layer structures form at least part of an electrically conductive coil structure surrounding at least part of the magnetic inlay, and
    wherein a length of different gaps between ring elements of the magnetic inlay is at least 1 μm.

12. The component carrier according to claim 11,
    wherein the magnetic inlay comprises at least one of the group consisting of a soft magnetic material, a semi-hard magnetic material, and a magnetic material composed of metal particles in a matrix.

13. The component carrier according to claim 11, wherein the coil structure comprises a plurality of vertical segments and a plurality of horizontal segments connected to form a plurality of windings.

14. The component carrier according to claim 13, comprising at least one of the following features:
    wherein the vertical segments comprise plated through-holes and/or slots filled with electrically conductive material;
    wherein the horizontal segments are located in two parallel planes between which the vertical segments are connected;
    wherein the horizontal segments extend radially outwardly with respect to a common center;
    wherein the horizontal segments are substantially triangular.

15. The component carrier according to claim 11, comprising at least one of the following features:
    wherein multiple gaps between ring segments of the magnetic inlay have substantially the same length;
    wherein the magnetic inlay and the coil structure are configured as an inductor or a transformer;
    wherein the magnetic inlay is at least partially coated with a cladding of electrically conductive material forming part of the coil structure;

wherein a minimum distance between the electrically conductive coil structure and the magnetic inlay is larger than 10 µm;

wherein the magnetic inlay has a central opening through which part of the coil structure extends;

wherein the coil structure extends over a larger vertical range than the magnetic inlay;

wherein the coil structure protrudes vertically beyond the magnetic inlay upwardly and/or downwardly;

wherein a trajectory connecting centers of windings of the coil structure is a circumferentially closed loop extending within a horizontal plane;

wherein central axes of at least part of windings of the coil structure extend within a horizontal plane;

wherein at least one of the electrically conductive layer structures comprises at least one of the group consisting of copper, aluminum, nickel, silver, gold, palladium, and tungsten;

wherein the at least one electrically insulating layer structure comprises at least one of the group consisting of reinforced or non-reinforced resin, epoxy resin or bismaleimide-triazine resin, FR-4, FR-5, cyanate ester resin, polyphenylene derivate, glass, prepreg material, polyimide, polyamide, liquid crystal polymer, epoxy-based build-up film, polytetrafluoroethylene, a ceramic, and a metal oxide;

wherein the component carrier is shaped as a plate;

wherein the component carrier is configured as one of the group consisting of a printed circuit board, a substrate, and an interposer;

wherein the component carrier is configured as a laminate-type component carrier.

16. The component carrier according to claim 11, wherein the magnetic inlay is composed of multiple vertically stacked and laterally overlapping magnetic bodies, in particular magnetic bars.

17. The component carrier according to claim 11, wherein the magnetic inlay is a closed ring or a ring with one gap.

18. The component carrier according to claim 11, wherein the magnetic inlay is an open ring structure composed of a plurality of ring segments with at least two gaps in between.

19. The component carrier according to claim 11, wherein a recess of the magnetic inlay is at least partially filled with a dielectric platelet made of the same material as the at least one electrically insulating layer structure made of a thermally conductive prepreg having a heat conductivity in a range from 2 W/mK to 20 W/mK and/or comprising thermally conductive additives.

20. The component carrier according to claim 11, comprising a heat removal structure forming part of the stack, configured for removing heat from at least one of the group consisting of the coil structure and the magnetic inlay to an exterior of the component carrier, wherein the heat removal structure comprises at least one of the group consisting of a metallic material and a thermally conductive prepreg having a heat conductivity in a range from 2 W/mK to 20 W/mK.

* * * * *